United States Patent [19]
Karl et al.

[11] Patent Number: 5,184,723
[45] Date of Patent: Feb. 9, 1993

[54] SINGLE WAFER ROBOTIC PACKAGE

[75] Inventors: Randy L. Karl, Chanhassen; Dale A. Maenke, Chaska, both of Minn.

[73] Assignee: Fluoroware, Inc., Chaska, Minn.

[21] Appl. No.: 699,753

[22] Filed: May 14, 1991

[51] Int. Cl.$^5$ ............................................. B65D 85/48
[52] U.S. Cl. ................................. 206/454; 206/328; 206/334; 118/503; 118/500
[58] Field of Search ............... 206/303, 328, 329, 334, 206/454, 486, 490, 586; 118/500, 503

[56] References Cited

U.S. PATENT DOCUMENTS

| | | | |
|---|---|---|---|
| 3,672,495 | 6/1972 | Bauer et al. | 206/328 |
| 3,719,273 | 3/1973 | Abe | 206/328 |
| 4,076,119 | 2/1978 | Clarke | 206/303 |
| 4,120,398 | 10/1978 | Braddon, Sr. | 206/303 |
| 4,473,455 | 9/1984 | Dean et al. | 118/503 |
| 4,511,038 | 4/1985 | Miller | 206/454 |
| 4,634,512 | 1/1987 | Allen et al. | 118/503 |
| 4,653,636 | 3/1987 | Armstrong | 206/454 |
| 4,724,963 | 2/1988 | Mortensen | 206/454 |
| 4,779,724 | 10/1988 | Benz et al. | 206/454 |
| 4,779,877 | 10/1988 | Shaw | 118/503 |
| 4,817,795 | 4/1989 | Kos | 206/586 |
| 4,981,222 | 1/1991 | Lee | 211/41 |
| 5,035,322 | 7/1991 | Faes et al. | 206/334 |

FOREIGN PATENT DOCUMENTS 101258 8/1979 Japan ................................... 118/500

OTHER PUBLICATIONS

R. H. Brunner "Wafer Chuck" Jun. 1974, IBM Technical Disclosure Bulletin vol. 17, No. 1.

*Primary Examiner*—David T. Fidei
*Attorney, Agent, or Firm*—Palmatier, Sjoquist & Helget

[57] ABSTRACT

A package for storing and transporting a single wafer of silicon or the like which may be 300 millimeters or more in diameter. The package has a U-shaped frame with a ledge on it for supporting the edge of a wafer, the open side of the U-shaped frame permitting insertion and removal of a wafer; a top panel affixed to the U-shaped frame and traversing the U-shaped frame defining a wafer compartment with the frame, and confining the wafer therein; a retainer traversing the open side of the compartment to obstruct removal of the wafer; wafer clamping devices confronting the ledge to clamp the edge portion of a wafer thereon; an access slot through the ledge portion of the frame to obtain access to the edge of the wafer for lifting it; the entire frame portion being open in a downward direction as to open the lower side of the wafer compartment to allow obtaining access to the wafer; the frame also having stacking ribs and grooves; a robot handle on the top panel and an adjacent operator for the retainer to also be operated by a robot.

8 Claims, 4 Drawing Sheets

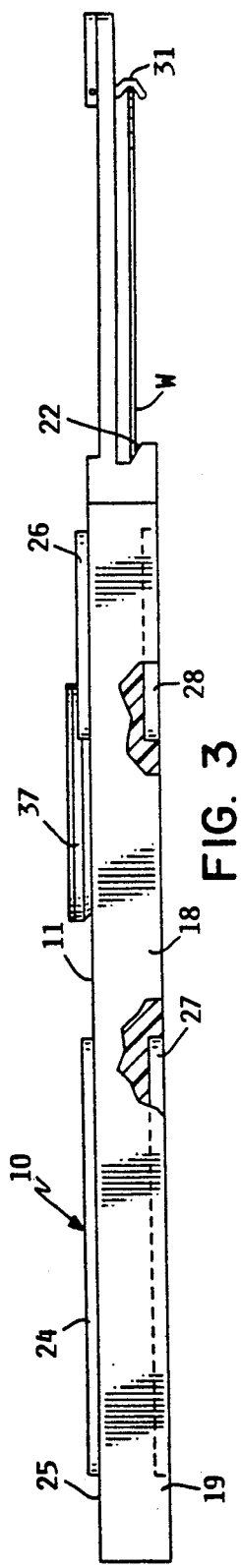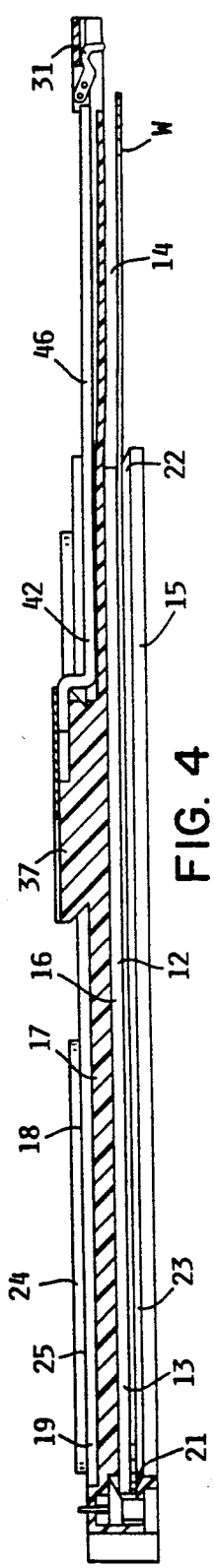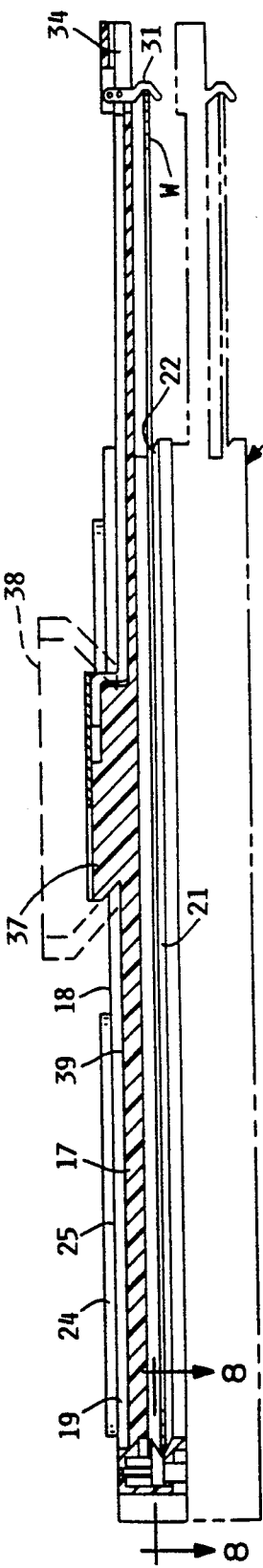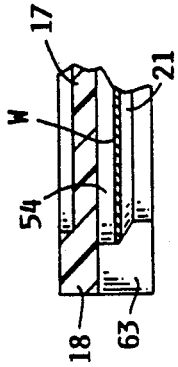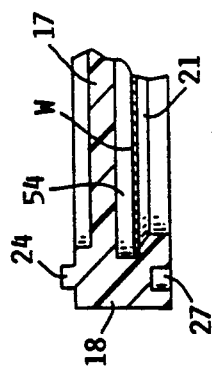

SINGLE WAFER ROBOTIC PACKAGE

This invention relates to a container or a package to contain a single large diameter silicon wafer and to be adapted to be handled by robots.

BACKGROUND OF THE INVENTION

It is being found in the processing of silicon wafers into circuit chips, that substantial efficiencies can be obtained by increasing the diameter of the wafers being processed while maintaining the thickness of the wafers as in past practice. For instance, wafers as large as 300 millimeters in diameter are available for use. Other wafers may be as large as 500 millimeters in diameter, and the same technique in handling wafers can be used with smaller wafers such as those of about 200 millimeters in diameter. Such wafers are approximately two millimeters in thickness. Accordingly, it will be readily understood that silicon wafers, which tend to be brittle, must be handled carefully in such large diameter sizes.

SUMMARY OF THE INVENTION

An object of the invention is to provide a container or a package for readily handling large diameter silicon wafers in the processing of such wafers into circuit chips.

A feature of the invention is a wafer container shaped to support a large diameter wafer at its peripheral edge portion and to accommodate loading and unloading of the wafer relative to the package by producing relative movement between the wafer and the package in a direction parallel to the plane of the wafer.

Another feature of the invention is to provide such a wafer package with a pickup device to accommodate grasping and handling of the package by means of a robotic clamp or arm, and a locking device to assure that the wafer is locked in the open-sided package when the package and wafer are being moved.

Another feature of the invention is the provision of locking devices to clamp peripherally spaced portions of the wafer in the package to minimize the possibility of any movement of the wafer as it is being stored or transported in the package.

A still further feature of the invention is the provision of an open bottom of the package to allow access to the bottom side of the wafer as the primary circuit side is maintained in an upward facing direction for maximum protection from damage; and also accommodating stacking of such a package on a similar package therebelow, and another thereabove. The wafer may, alternately, be carried with the primary circuit side facing downward to minimize particle collection thereon, and to accommodate visual inspection and indentification.

The large wafer supporting package provides the advantage of protecting such a wafer against damage while adequately supporting it at its perimeter; minimizing the generation of particles as the wafer is being inserted into and removed from the wafer, thereby contributing to the continued cleanliness of the wafer in use.

BRIEF DESCRIPTION OF THE DRAWINGS

FIG. 3 is a side elevation view thereof.

FIG. 4 is a detail section view taken approximately along a broken line at 4—4 of FIG. 1.

FIG. 5 is a section view similar to FIG. 4 but showing an alternate position of certain aspects of the invention.

FIG. 6 is an enlarged detail section view taken at 6—6 of FIG. 1.

FIG. 7 is an enlarged detail section view taken approximately at 7—7 of FIG. 1.

DETAILED SPECIFICATION

Figure 2:
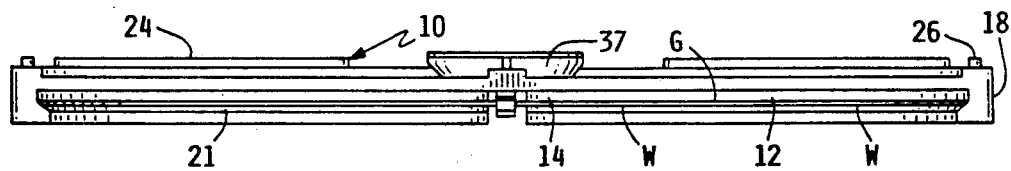
FIG. 2 is an end elevation view thereof.

One form of the invention is illustrated in the drawings and described herein.

The wafer package is indicated in general by numeral 10 and is well adapted to carry a large wafer W for storage and transport; and to especially protect the primary circuit side G (sometimes called the "green" side) of the wafer which has coatings being processed to form multiple circuits. The wafer W is most often made of silicon, but could be of other substances such as gallium arsenide; however, where herein the wafer is referred to as a silicon wafer, that designation is intended to include wafers of various sorts, such as those made of gallium arsenide. The wafer W is typically approximately 300 millimeters in diameter, and has a thickness that will vary depending upon the material from which the wafer is made and the particular application intended. Thickness may be in the general range of 0.030 inches or approximately 0.76 millimeters. Of course, wafers larger than that specified could be used, and undoubtedly will be used, with this type of package.

The package 10, in general, defines an enclosure 11 forming a generally wafer-shaped compartment 12 having a substantially semicircularly-shaped closed side portion 13 and a open side portion 14 through which the wafer may be inserted and removed. The wafer compartment 12 has an open bottom 15 through which access to the wafer W may be obtained for inserting and removing the wafer via open side portion 14; and the compartment also has a closed top 16, being closed by a panel 17. The enclosure 11, which consists principally of the top panel 17 and a generally U-shaped frame 18, is preferably formed of molded plastic, utilizing a type of plastic that is resistant to damage and also resistant to particle generation as it is manipulated. Plastics such as polycarbonate, ABS, polypropylene, and PFA fluoropolymer may be used, depending upon the exact use to which the package is being put and the environment in which it is expected to be used.

Figure 10:
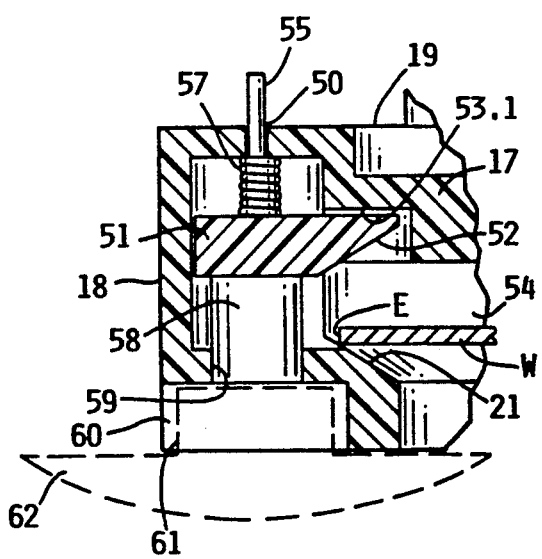
FIG. 10 is a detail section view like FIG. 9, but showing a shifted position of certain portions of the device.

The frame 18 has a semicircular side portion 19 and end portions 20 which extend generally parallel to each other but diverge slightly as to accommodate easy access of a wafer into the compartment 12. The frame 18 defines an inclined ledge portion 21 which extends throughout the full length of the frame for supporting the wafer W at its peripheral edge and for guiding the wafer as the wafer is inserted into and removed from the compartment 12. The peripheral edge portion E of the wafer W is substantially square cornered, as best illustrated in FIG. 10, and because the wafer supporting ledge 21 is inclined or tapered, the amount of surface of the wafer which actually engages the ledge is at a minimum. The actual engagement between the wafer and the ledge 21 is essentially along only a line which follows the peripheries of the wafer edge E and the semicircular shape of the ledge 21 as it extends around the side 19 of the frame.

At the end portions 20 of the frame 18, the end portions 22 of the ledge 21 extend substantially linearly, as contrasted with the portions 23 of the ledge which extend in a semicircular direction along the semicircular side portion 19 of the frame 18. It will be seen that the frame 18 is molded integrally with the top panel 17. It is desirable in many cases that the top panel 17 be transparent so that inspection of the wafer W can be readily accomplished.

Stacking of the package 10 upon another identical package is accommodated in order that a number of such wafers may be conveniently stored in one location. The frame 18 is provided with a pair of upstanding ribs 24 which extend in a partially circular direction along the partially circular side portion 19 of the frame 18, and the ribs 24 protrude slightly upwardly from the top surface 25 of the frame. The frame 18 also has a second pair of upstanding ribs 26 extending linearly along the linear portions 20 of the frame, and the ribs 26 also protrude slightly upwardly from the top surface 25 of the frame.

The frame 18 also has a pair of curved recesses 27 and a pair of linear recesses 28 which are respectively disposed immediately below the ribs 24 and 26 in order to fit with the ribs of an adjacent package 10 which is stacked with the package as shown. An additional package 10 is illustrated in FIG. 5 in dotted lines to show the manner in which the packages may be stacked, one upon another.

It will be seen that the top panel 17 has one side 29 shaped to follow the curvatuve of the curved side portion 19 of the frame 18, and the other side portion 30 of the top panel which is adjacent the open side portion 14 of the compartment, has a generally curved shape so as to generally follow the shape of the wafer W and to extend beyond the edge of the wafer so as to fully protect the wafer from above and to span the entire width of the wafer.

A hook-shaped wafer retainer 31 is swingably mounted by a pin 32 upon an elevated platform 33 formed integrally with the top panel 17, but protruding slightly above the top surface of the platform 17. It will be recognized that the platform 17 has a slot 34 in which the retainer 31 resides and is swingable, and the top platform 33 also has a slot 35 in which the upper portion of the retainer 31 is mounted.

The lower hook-shaped portion of the retainer 31 traverses across the thickness of the opening 12 and particularly at the open side portion 14 thereof to confront the edge portion of the wafer and obstruct any possible movement of the wafer in an outward direction. Preferably, when the wafer is in correct position in the compartment 12 and resting upon the supporting ledge 21, the retainer 31 will not engage the edge of the wafer, but the retainer will prevent movement of the wafer out of the compartment 12 if the package 10 might be tilted or jostled in its movement.

Figure 13:
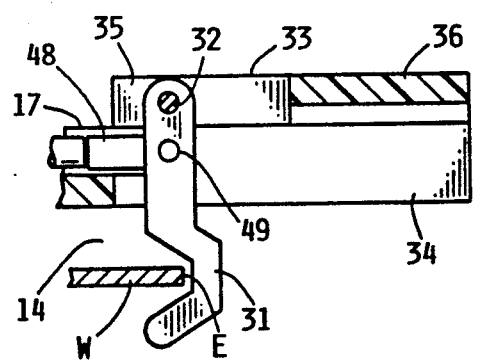
FIG. 13 is an enlarged detail section view taken approximately at 13—13 of FIG. 12.

The retainer is swingable between the obstructing position illustated in FIGS. 5 and 13 to a retracted position illustrated in FIG. 4 which permits insertion and removal of the wafer relative to the compartment 12. The platform 33 has a bridging portion 36 spanning across the slot 34 and also serving to limit the upward swinging of the retainer 31, as illustated in FIG. 4. robot knob 37 also slidably mounts the end of a slidable operating rod 42 which is connected to the retainer 31 which obstructs movement of the wafer from the compartment 12 The operating rod 42 has one end portion 43 slidably mounted in a groove or opening 44 in the robot handle 37, along with a spring 45 which bears against the end portion 43 of the operating rod to continuously urge the operating rod in an outward direction of the opening 44. The other end portion 46 of the operating rod 42 lies in a groove 47 formed in the top panel 17 and has its terminal end portion 48 connected by a pin 49 to the swingable retainer 31 in order to move the retainer 31 from the obstructing position illustrated in FIGS. 5 and 13 to the retracted position illustrated in FIG. 4. It will be recognzied in FIG. 11 that the operating rod 42 traverses the tapered or inclined side portion 41 of the robot handle 37 and accordingly, when the robot arm 38 engages and grips the robot handle 37, the robot arm 38 may also engage and move the operating rod 42. Normally, the spring 45 will urge the end portion 43 outwardly of the recess 44 so as to move the entire rod 42, causing the retainer 31 to swing into retracted position as illustrated in FIG. 4. However, when the robot arm or handle grips the knob 37 and also engages the operating rod 42, the operating rod 42 will be urged endways into the recess 44 so as to retract the end portion 46, causing the retainer 31 to swing into obstructing position as illustrated in FIGS. 5 and 13.

In order to minimize movement of the wafer W in the compartment 12, the package 10 is provided with three clamping devices 50 for clamping the wafer onto the ledge 21 of the frame 18 and preventing the wafer from moving upwardly off the ledge 21 as the package 10 is being moved or transported. As illustated in FIG. 1, the clamping devices 50 are spaced from each other around the partially circular side portion 19 of the frame 18 so as to engage widely spaced portions of the wafer adjacent its edge E.

Figure 8:
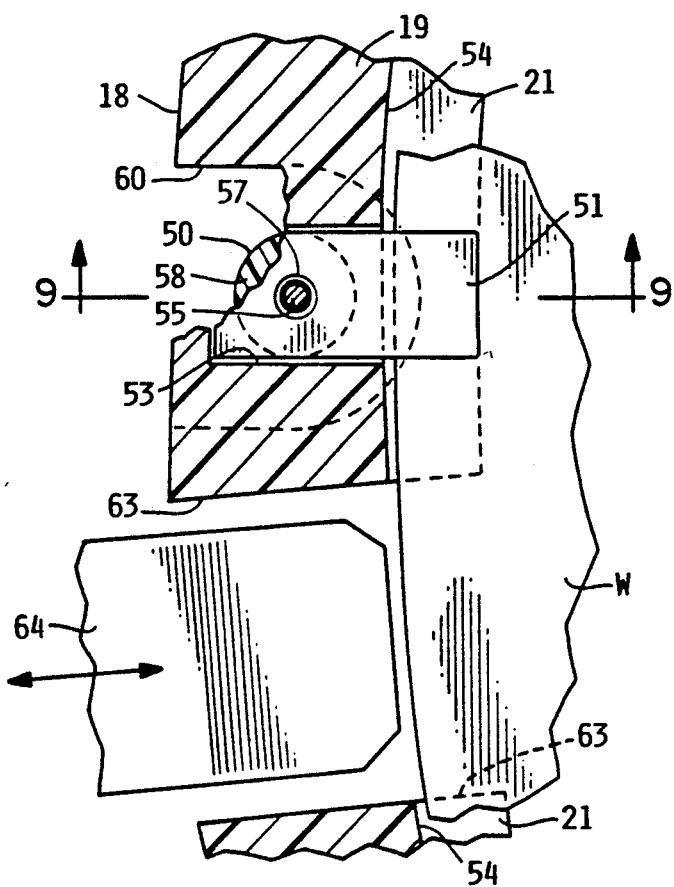
FIG. 8 is an enlarged detail section view taken approximately at 8—8 of FIG. 5.
Figure 9:
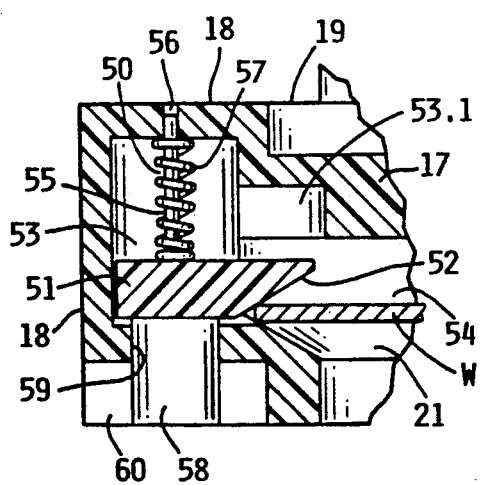
FIG. 9 is an enlarged detail section view taken approximately at 9—9 of FIG. 8.

All of the clamping devices 50 are identical and the details of one of them is illustrated in FIGS. 8-10. The clamping device 50 includes a clamp bar 51 having a tapered or inclined end face 52 oriented to generally confront the adjacent portion of the ledge 21 so as to cooperate with the ledge 21 in clamping the edge portion of the wafer, substantially as illustrated in FIG. 9. The clamping bar 51 is confined in a recess 53 formed in the frame 18 and opening through the peripheral wall 54 of the frame 18 adjacent the ledge 21. It will be recognized in FIGS. 9 and 10, that a portion 53.1 of the recess 53 is formed in the top panel 17 to accommodate retraction of the clamp bar in an upward direction as illustrated in FIG. 10. The clamp bar 51 has an upwardly extending guide pin 55 protruding through an aperture 56 in the frame 18 as to guide the clamp bar in its upward and downward movement. A coil spring 57 surrounds the pin 55 and the ends of the spring 57 bear against the adjacent portion of the frame and against the clamp bar 51 to ordinarily urge the clamp bar toward its lower wafer clamping position as illustrated in FIG. 9.

The clamp bar 51 also has a downwardly extending peg or rod 58 affixed thereto and protruding through an aperture 59 to be guided by the frame 18 as the clamp bar and the peg 58 move upwardly and downwardly. The frame 18 has a recess 60 beneath the clamp bar 51 and adjacent the aperture 59 to receive the peg 58 therein when the clamp bar is moved into the lower clamping position. The recess 60 is for the purpose of receiving a fixture 61 which protrudes upwardly from the table 62 upon which the package 10 may be placed, so that the fixture 61 will engage the peg 58 and lift the peg along with the clamp bar 51 into the upper position of the clamp bar, as illustrated in FIG. 10, wherein the clamp bar has released the wafer W. Accordingly, when the package 10 is lifted off the table 62, the fixture 61 is withdrawn from the recess 60 and out of engagement with the peg 58, thereby allowing the spring 57 to move the clamp bar 51 into clamping position on the wafer W again. Accordingly, the wafer is in clamped condition by the several clamping devices 50 when the robot lifts the pacakge off the table and the wafers are thereby prevented, while transport is occurring, from being jostled or from moving in the compartment 12.

Figure 1:
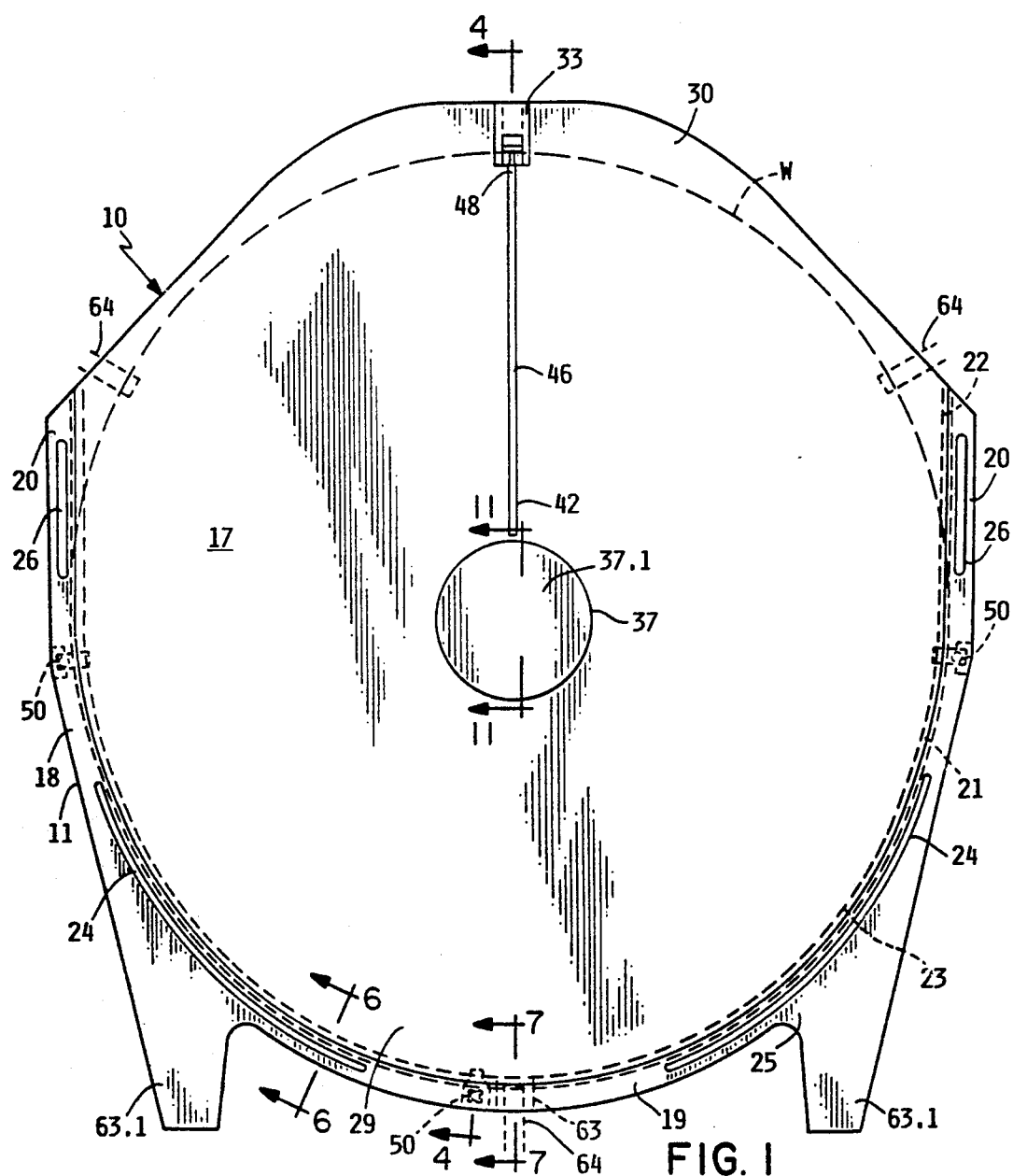
FIG. 1 is a top plan view of the single wafer robotic package.

The frame 18 is also provided with at least one access slot 63 entirely through the width of the frame 18 below the level of the top panel 17, subtantially as illustrated in FIGS. 7 and 8. The slot 63 extends entirely through the adjacent inclined wafer supporting ledge 21 and through the peripheral surface 54 of the frame. The slot 63 is for the purpose of allowing a robot finger or arm 64 to obtain access to the edge portion of the wafer W in order to lift the wafer off the ledge portion 21. Additional robot fingers 64 for lifting the wafer W will be able to obtain access to the edge portion of the wafer adjacent the end portions 20 of the frame, substantially as illustrated in FIG. 1. Accordingly, the robot fingers 64 may lift the wafer W at three locations about its periphery for the purpose of moving the wafer either into or out of the compartment 12. It will be recognized that other fixtures or devices will hold the package 10, and either the wafer or the package will be moved during insertion and removal of the wafer relative to the compartment 12.

Figure 11:
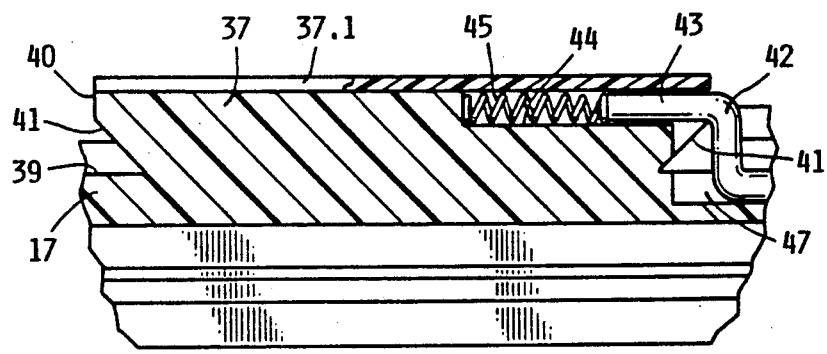
FIG. 11 is an enlarged detail section view taken approximately at 11—11 of FIG. 1.
Figure 12:
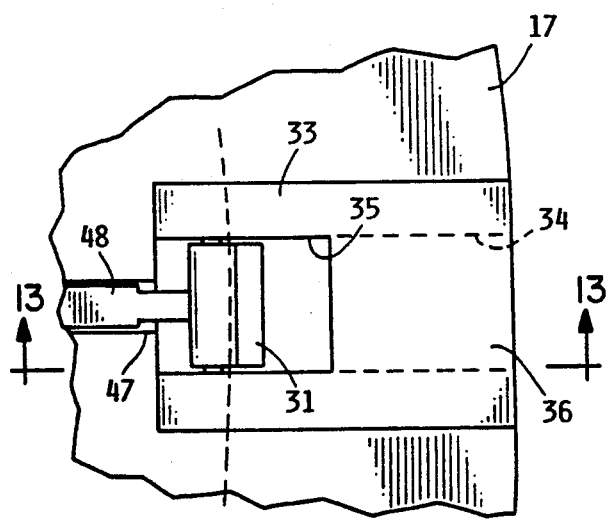
FIG. 12 is an enlarged detail plan view of a portion of the device.

As illustrated in FIG. 11, the robot handle or knob 37 will be covered with a rigid panel 37.1 to close the recess 44 and confine the end portion 43 of the operating rod 42 therein.

Ordinarily in the use of the package 10, the edge portion of the wafer W will rest upon the semicircular ledge 21. If the pacakge is simply being used to store the wafer W, the package may rest upon a flat shelf or supporting table and in this condition, the clamping bars 51 will be in clamping engagement with the edge portion of the wafer as illustated in FIG. 9. Other pacakges of the same nature as is illustated may be stacked upon the pacakge 10 or the package 10 may be stacked upon other identical packages therebelow. When the package 10 is to be moved so that the wafer may be processed, the robot arm 38 will grip the handle portion 37 for the purpose of lifting the package and transporting it. As the robot arm grips the handle 37, the operating rod will also be engaged by the robot and the rod will be retracted into the position illustrated in FIG. 5 so as to swing the retainer 31 into confronting relation with the edge portion E of the wafer adjacent the open side 14 of the compartment, which forms the opening through which the wafer W might move out of the package.

Accordingly, as the package is being moved, the wafer is fully retained in the compartment, both by the retainer 31 and by the clamping bars 51.

In a few instances, the package may be placed in an upright position rather than in a horizontal position, whereupon the package will be supported by feet 63 which are formed integrally of the frame 18.

Ordinarily, when the robot moves the package from its storage postion, the wafer is to be processed and the the package will be placed upon a table 62, as illustated in FIG. 10, so that a fixture 61 will lift the peg 58, causing the clamp bar 51 to release the wafer W. As the robot has placed the package on the table 62, the robot will release the handle 37 and release the operating rod 42, whereupon the spring 44 will move the operating rod into the position illustrated in FIG. 4 wherein the retainer 31 is in retracted position, thereby opening the open side 14 of the compartment.

The robot fingers 64 may, in a suitably constructed support table or structure 62, protrude beneath the edge portion of the wafer W and lift the wafer off the ledge 21 and move the wafer edgeways out of the compartment 12. The robot fingers 64 will engage only the bottom side of the wafer, which does not carry the coating being processed, and the primary circuit side or coated upper side of the wafer will not be touched or damaged.

Subsequently, the wafer, or another wafer W, will be moved into the compartment 12 in an edgeways direction so that no portions of the wafer will engage any portion of the frame or package until the wafer is in the correct position with its edge portion E directly above the inclined ledge 21, whereupon the robot fingers will be lowered so as to lower the wafer onto the ledge portion.

As explained previously, as the robot picks up the wafer again, the retainer 31 will swing into obstructing relation with the open side portion 14 of the compartment, and the clamping bars 51 will descend into clamping relation with the adjacent edge portions of the wafer.

If the package is then stacked upon another identical package, the ribs 24, 26 of the package upon which the package 10 rests, will be inserted into the recesses or grooves 27 so as to make sure that the package is stacked in secure relationship. The robot handle 37 of the package therebelow will protrude slightly into the open bottom 15 of the compartment 12, but not so much as to engage or bear against the bottom side of the wafer. The height of the robot arm 37, above the top surface of the frame 18, is less than the depth of the open bottom portion 15 of the compartment, between the bottom surface of the frame and the wafer on the ledge 21.

It will be seen that this invention provides a package for storing and transporting a single large silicon wafer which may be in the range of 300 millimeters in diameter, whereby the wafer rests upon a ledge which engages only the bottom side of the wafer and the top coated side of the wafer, or its primary circuit side will not be engaged by any part of the package at any time. While the wafer is in the package, it is clamped by the clamp bars and while the package is being transported, an additional retainer 31 will obstruct any possible movement of the wafer out through the open side of the compartment.

The present invention may be embodied in other specific forms without departing from the spirit or essential attributes thereof, and it is therefore desired that the present embodiment be considered in all respects as illustrative and not restrictive, reference being made to the appended claims rather than to the foregoing description to indicate the scope of the invention.

I claim:

1. A wafer storing package for storing a single silicon wafer, comprising an enclosure means comprising a U-shaped frame portion comprising a semicircular side portion and substantially parallel end portions, the enclosure means also comprising a top panel portion traversing the side and end portions of the frame portion and being affixed thereto, the frame portion and top panel portion defining and embracing a wafer compartment having an open bottom portion opposite to said top panel portion and also having a closed side portion adjacent the semicircular side portion of the frame portion and an open side portion adjacent the end portions of the frame portion, the frame portion also comprising a wafer supporting ledge portion extending around said semicircular side portion of the frame portion and confronting the top panel portion in spaced relation, the ledge portion being inclined to minimize the area of engagement between the wafer and the ledge portion, the spacing between the top panel portion and the ledge portion being greater than the thickness of the wafer to permit limited movement of the wafer in the compartment, the wafer compartment corresponding to the shape of the wafer and having a width between the closed and open side portions to confine substantially the entire width of the wafer, the enclosure means comprising a releasable retainer portion swingable into and out of obstructing relation with the open side portion of the wafer compartment to alternately retain and release the wafer in the compartment, and a handle portion on the top panel portion and having an operating portion thereon and connected with the retainer portion to move the retainer portion into and out of obstructing relation.

2. A wafer storing package for storing a single silicon wafer, comprising an enclosure means comprising a U-shaped frame portion comprising a semicircular side portion and substantially parallel end portions, the enclosure means also comprising a top panel portion traversing the side and end portions of the frame portion and being affixed thereto, the frame portion and top panel portion defining and embracing a wafer compartment having an open bottom portion opposite to said top panel portion and also having a closed side portion adjacent the semicircular side portion of the frame portion and an open side portion adjacent the end portions of the frame portion, the frame portion also comprising a wafer supporting ledge portion extending around said semicircular side portion of the frame portion and confronting the top panel portion in spaced relation, the ledge portion being inclined to minimize the area of engagement between the wafer and the ledge portion, the spacing between the top panel portion and the ledge portion being greater than the thickness of the wafer to permit limited movement of the wafer in the compartment, the wafer compartment corresponding to the shape of the wafer and having a width between the closed and open side portions to confine substantially the entire width of the wafer, the enclosure means comprising a wafer clamping portion on the frame portion and opposite the ledge portion to engage and restrict movement of the wafer, the clamping portion being retractable away from the ledge portion to release the wafer.

3. A wafer storing package according to claim 2 wherein the retractable wafer clamping portion is movable toward and away from the ledge portion, and a spring portion urging the clamping portion toward the ledge portion.

4. A wafer storing package according to claim 2 wherein the retractable wafer clamping portion is movable toward and away from the ledge portion, the clamping portion comprising a movable operating peg portion protruding downwardly from the ledge portion to be operated from below the ledge portion.

5. A wafer storing package for storing a single silicon wafer, comprising an enclosure means comprising a U-shaped frame portion comprising a semicircular side portion and substantially parallel end portions, the enclosure means also comprising a top panel portion traversing the side and end portions of the frame portion and being affixed thereto, the frame portion and top panel portion defining and embracing a wafer compartment having an open bottom portion opposite to said top panel portion and also having a closed side portion adjacent the semicircular side portion of the frame portion and an open side portion adjacent the end portions of the frame portion, the frame portion also comprising a wafer supporting ledge portion extending around said semicircular side portion of the frame portion and confronting the top panel portion in spaced relation, the ledge portion being inclined to minimize the area of engagement between the wafer and the ledge portion, the spacing between the top panel portion and the ledge portion being greater than the thickness of the wafer to permit limited movement of the wafer in the compartment, the wafer compartment corresponding to the shape of the wafer and having a width between the closed and open side portions to confine substantially the entire width of the wafer, the U-shaped frame portion comprising an access slot portion through the semicircular side portion and ledge portion of the frame portion to obtain access to the edge of the wafer lying on the ledge portion for moving the wafer.

6. A wafer storing package for storing a single silicon wafer, comprising an enclosure means comprising a U-shaped frame portion comprising a semicircular side portion and substantially parallel end portions, the enclosure means also comprising a top panel portion traversing the side and end portions of the frame portion and being affixed thereto, the frame portion and top panel portion defining and embracing a wafer compartment having an open bottom portion opposite to said top panel portion and also having a closed side portion adjacent the semicircular side portion of the frame portion and an open side portion adjacent the end portions of the frame portion, the frame portion also comprising a wafer supporting ledge portion extending around said semicircular side portion of the frame portion and confronting the top panel portion in spaced relation, the ledge portion being inclined to minimize the area of engagement between the wafer and the ledge portion, the spacing between the top panel portion and the ledge portion being greater than the thickness of the wafer to permit limited movement of the wafer in the compartment, the wafer compartment corresponding to the shape of the wafer and having a width between the closed and open side portions to confine substantially the entire width of the wafer, said enclosure means comprising a robot handle on the top panel portion and protruding therefrom and away from the wafer compartment, the frame portion having a thickness between the ledge portion and the open bottom of the compartment which is greater than the dimension by which the robot handle protrudes above the panel portion.

7. A package for storing a single silicon wafer, comprising enclosure means comprising, a generally U-shaped frame portion comprising a partially circular wafer embracing side portion and an open side portion through which a wafer may be inserted and removed, the enclosure means also comprising a top panel portion on the frame portion and traversing the partially circular side portion and open side portion, the frame portion and panel portion defining a single wafer-shaped compartment, the enclosure means also comprising an open bottom portion adjacent both side portions of the frame portion to obtain access into the compartment and to a wafer contained therein, the partially circular side portion of the frame portion comprising a wafer supporting ledge portion confronting and spaced from the panel portion to permit limited movement of the wafer between the ledge portion and the panel portion, a wafer retainer portion on the panel portion adjacent said open side portion and traversing said compartment to obstruct movement of the wafer into and out of the compartment, a plurality of releasable wafer clamping portions spaced from each other on the frame portion and confronting the ledge portion, a robot handle portion on the panel portion to be gripped by a robot for moving the package, and a retainer operating portion on the enclosure adjacent the handle portion to be operated by the robot.

8. A wafer storing pacakge according to claim 2 wherein said wafer clamping portion comprises a wafer engaging face portion opposite the ledge portion, said face portion and ledge portion being inclined in opposite directions to minimize the area of engagement between the wafer and the clamping portion.

* * * * *